United States Patent
Hirai et al.

(10) Patent No.: US 10,763,826 B2
(45) Date of Patent: Sep. 1, 2020

(54) POLYPHASE FILTER

(71) Applicant: MITSUBISHI ELECTRIC CORPORATION, Tokyo (JP)

(72) Inventors: Akihito Hirai, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/479,894

(22) PCT Filed: Mar. 2, 2017

(86) PCT No.: PCT/JP2017/008239
§ 371 (c)(1),
(2) Date: Jul. 22, 2019

(87) PCT Pub. No.: WO2018/158902
PCT Pub. Date: Sep. 7, 2018

(65) Prior Publication Data
US 2019/0379356 A1 Dec. 12, 2019

(51) Int. Cl.
*H03H 11/04* (2006.01)
*H03H 11/22* (2006.01)

(52) U.S. Cl.
CPC ......... *H03H 11/0422* (2013.01); *H03H 11/22* (2013.01)

(58) Field of Classification Search
CPC .... H03H 11/0422; H03H 11/20; H03H 11/22; H03H 11/04
See application file for complete search history.

(56) References Cited

U.S. PATENT DOCUMENTS

| 4,866,397 A | 9/1989 | Kimyacioglu |
| 6,636,085 B2 * | 10/2003 | Okazaki ............... H03H 7/21 327/101 |
| 2003/0189462 A1 | 10/2003 | Okada |

FOREIGN PATENT DOCUMENTS

| JP | 3-70305 A | 3/1991 |
| JP | 10-70418 A | 3/1998 |
(Continued)

OTHER PUBLICATIONS

International Search Report for PCT/JP2017/008239 (PCT/ISA/210) dated May 23, 2017.
(Continued)

*Primary Examiner* — Jung Kim
(74) *Attorney, Agent, or Firm* — Birch, Stewart, Kolasch & Birch, LLP

(57) ABSTRACT

A first transistor (2a), a second transistor (2b), a third transistor (2c) and a fourth transistor (2d) are provided. A first transistor (2a) amplifies a first I signal $V_{IP}$ inputted from a first input terminal (1a). A second transistor (2b) amplifies a first Q signal $V_{QP}$ inputted from a second input terminal (1b). A third transistor (2c) amplifies a second I signal $V_{IN}$ when the second I signal $V_{IN}$ is inputted from a third input terminal (1c), the second I signal $V_{IN}$ forming a differential signal with the first I signal $V_{IP}$. A fourth transistor (2d) amplifies a second Q signal $V_{QN}$ when the second Q signal $V_{QN}$ is inputted from a fourth input terminal (1d), the second Q signal $V_{QN}$ forming a differential signal with the first Q signal $V_{QP}$.

4 Claims, 7 Drawing Sheets

(56) References Cited

FOREIGN PATENT DOCUMENTS

| JP | 11-205047 A | 7/1999 |
| JP | 2001-45080 A | 2/2001 |
| JP | 2003-298394 A | 10/2003 |
| JP | 2005244877 A | 9/2005 |
| JP | 2010-21826 A | 1/2010 |

OTHER PUBLICATIONS

Japanese Final Office Action dated Dec. 12, 2017 in Japanese Patent Application No. 2017-539684.
Japanese Office Action dated Sep. 19, 2017 in Japanese Patent Application No. 2017-539684.
Extended European Search Report issued in corresponding European Patent Application No. 17898608.9 dated Dec. 10, 2019.
Haddad Fayrouz et al., "Fully-integrated image rejection RF front-end design", New Circuits and Systems Conference (NEWCAS), 2011 IEEE 9th International, IEEE, Jun. 26, 2011, pp. 522-525.

\* cited by examiner

POLYPHASE FILTER

TECHNICAL FIELD

The present invention relates to a polyphase filter including a transistor.

BACKGROUND ART

In a wireless communication device, a semiconductor integrated circuit that processes high-frequency received signals is used in many cases.

For example, in a semiconductor integrated circuit that forms a superheterodyne receiver for a radar, in addition to a filter capable of limiting the frequency band of received signals, there is a case that a polyphase filter or the like capable of suppressing image disturbing waves associated with frequency conversion of received signals is used.

The following Patent Literature 1 discloses a polyphase filter including a plurality of resistors and a plurality of capacitors.

The polyphase filter is originally used for generation of signals with a 90-degree phase difference, and the like, but is also capable of suppressing image disturbing waves.

In the polyphase filter, frequencies at which image disturbing waves can be suppressed change dependently on the resistance values of the resistors included therein and the capacitance values of the capacitors included therein.

A center frequency Fc of the frequencies at which image disturbing waves can be suppressed is represented by the following formula (1):

$$F_C = \frac{1}{2\pi RC} \quad (1)$$

In formula (1), R represents the resistance values of the resistors and C represents the capacitance values of the capacitors.

CITATION LIST

Patent Literature

Patent Literature 1: JP 2010-21826 A

SUMMARY OF INVENTION

Technical Problem

Since the conventional polyphase filter is formed as described above, by controlling the resistance values R of the resistors included therein, the frequencies at which image disturbing waves can be suppressed can be changed. However, since the polyphase filter is formed using a resistor which is a passive element, there is a problem that pass loss occurs upon suppression of image disturbing waves.

The invention is made to solve the above problem, and an object of the invention is to obtain a polyphase filter capable of suppressing the occurrence of pass loss.

Solution to Problem

A polyphase filter according to the present invention includes: a first transistor amplifying a first I signal inputted from a first input terminal; a second transistor amplifying a first Q signal inputted from a second input terminal; a third transistor amplifying a second I signal when the second I signal is inputted from a third input terminal, the second I signal forming a differential signal with the first I signal; a fourth transistor amplifying a second Q signal when the second Q signal is inputted from a fourth input terminal, the second Q signal forming a differential signal with the first Q signal; a first capacitor connected between an output terminal of the first transistor and the second input terminal; a second capacitor connected between an output terminal of the second transistor and the third input terminal; a third capacitor connected between an output terminal of the third transistor and the fourth input terminal; and a fourth capacitor connected between an output terminal of the fourth transistor and the first input terminal. An angular frequency determined in accordance with a transconductance of each of the first to fourth transistors and a capacitance of each of the first to fourth capacitors is changed by changing a current flowing through each of the first to fourth transistors. Each of the first to fourth transistors is a bipolar transistor whose base terminal is grounded. An emitter terminal of the first transistor is connected to the first input terminal, and a collector terminal of the first transistor is the output terminal of the first transistor. An emitter terminal of the second transistor is connected to the second input terminal, and a collector terminal of the second transistor is the output terminal of the second transistor. An emitter terminal of the third transistor is connected to the third input terminal, and a collector terminal of the third transistor is the output terminal of the third transistor. An emitter terminal of the fourth transistor is connected to the fourth input terminal, and a collector terminal of the fourth transistor is the output terminal of the fourth transistor.

Advantageous Effects of Invention

According to the invention, the configuration includes: a first transistor amplifying a first I signal inputted from a first input terminal; a second transistor amplifying a first Q signal inputted from a second input terminal; a third transistor amplifying a second I signal when the second I signal is inputted from a third input terminal, the second I signal forming a differential signal with the first I signal; and a fourth transistor amplifying a second Q signal when the second Q signal is inputted from a fourth input terminal, the second Q signal forming a differential signal with the first Q signal. Thus, there is an effect of being able to suppress the occurrence of pass loss.

DESCRIPTION OF EMBODIMENTS

For explaining the present invention in more detail, some embodiments for carrying out the invention will be described below with reference to the accompanying drawings.

First Embodiment

Figure 1:
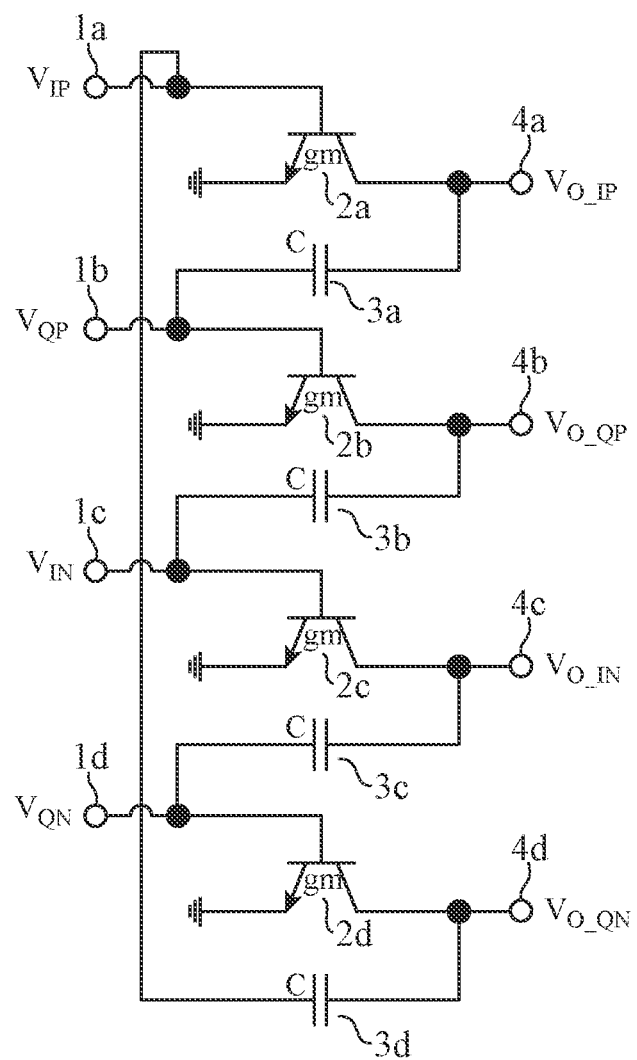
FIG. 1 is a circuit diagram showing a polyphase filter of a first embodiment of the invention.

FIG. 1 is a circuit diagram showing a polyphase filter of a first embodiment of the invention.

In FIG. 1, a first input terminal 1a is a terminal to which a first I signal $V_{IP}$ is inputted.

A second input terminal 1b is a terminal to which a first Q signal $V_{QP}$ is inputted.

A third input terminal 1c is a terminal to which a second I signal $V_{IN}$ which forms a differential signal with the first I signal $V_{IP}$ is inputted. Ideally, $V_{IP}+V_{IN}=0$.

A fourth input terminal 1d is a terminal to which a second Q signal $V_{QN}$ which forms a differential signal with the first Q signal $V_{QP}$ is inputted. Ideally, $V_{QP}+V_{QN}=0$.

A first transistor 2a is a bipolar transistor having a transconductance $g_m$ and having an emitter terminal grounded.

The first transistor 2a has a base terminal connected to the first input terminal 1a and a collector terminal (an output terminal of the first transistor 2a) connected to a first output terminal 4a, and amplifies the first I signal $V_{IP}$ inputted from the first input terminal 1a and outputs the amplified first I signal $V_{IP}$ to the first output terminal 4a.

A second transistor 2b is a bipolar transistor having a transconductance $g_m$ and having an emitter terminal grounded.

The second transistor 2b has a base terminal connected to the second input terminal 1b and a collector terminal (an output terminal of the second transistor 2b) connected to a second output terminal 4b, and amplifies the first Q signal $V_{QP}$ inputted from the second input terminal 1b and outputs the amplified first Q signal $V_{QP}$ to the second output terminal 4b.

A third transistor 2c is a bipolar transistor having a transconductance $g_m$ and having an emitter terminal grounded.

The third transistor 2c has a base terminal connected to the third input terminal 1c and a collector terminal (an output terminal of the third transistor 2c) connected to a third output terminal 4c, and amplifies the second I signal $V_{IN}$ inputted from the third input terminal 1c and outputs the amplified second I signal $V_{IN}$ to the third output terminal 4c.

A fourth transistor 2d is a bipolar transistor having a transconductance $g_m$ and having an emitter terminal grounded.

The fourth transistor 2d has a base terminal connected to the fourth input terminal 1d and a collector terminal (an output terminal of the fourth transistor 2d) connected to a fourth output terminal 4d, and amplifies the second Q signal $V_{QN}$ inputted from the fourth input terminal 1d and outputs the amplified second Q signal $V_{QN}$ to the fourth output terminal 4d.

A first capacitor 3a has one end connected to the collector terminal of the first transistor 2a and the other end connected to the second input terminal 1b.

A second capacitor 3b has one end connected to the collector terminal of the second transistor 2b and the other end connected to the third input terminal 1c.

A third capacitor 3c has one end connected to the collector terminal of the third transistor 2c and the other end connected to the fourth input terminal 1d.

A fourth capacitor 3d has one end connected to the collector terminal of the fourth transistor 2d and the other end connected to the first input terminal 1a.

The first output terminal 4a is connected to the collector terminal of the first transistor 2a and outputs a first I signal $V_{O\_IP}$ amplified by the first transistor 2a.

The second output terminal 4b is connected to the collector terminal of the second transistor 2b and outputs a first Q signal $V_{O\_QP}$ amplified by the second transistor 2b.

The third output terminal 4c is connected to the collector terminal of the third transistor 2c and outputs a second I signal $V_{O\_IN}$ amplified by the third transistor 2c.

The fourth output terminal 4d is connected to the collector terminal of the fourth transistor 2d and outputs a second Q signal $V_{O\_QN}$ amplified by the fourth transistor 2d.

Figure 2:
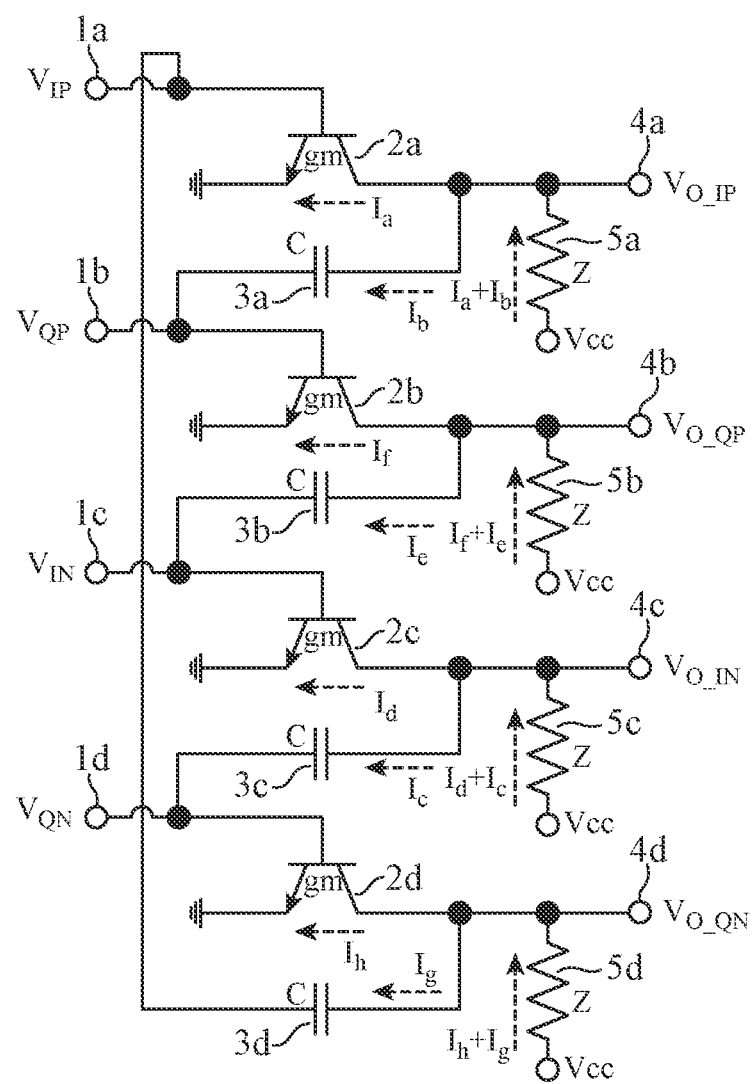
FIG. 2 is a circuit diagram showing another polyphase filter of the first embodiment of the invention.

FIG. 2 is a circuit diagram showing another polyphase filter of the first embodiment of the invention.

The polyphase filter of FIG. 2 differs from the polyphase filter of FIG. 1 in that each of the collector terminals (output terminals) of the first to fourth transistors is connected to a power supply Vcc through a load.

A load 5a is a resistor whose impedance is Z, and has one end connected to the collector terminal of the first transistor 2a and the other end connected to the power supply Vcc.

A load 5b is a resistor whose impedance is Z, and has one end connected to the collector terminal of the second transistor 2b and the other end connected to the power supply Vcc.

A load 5c is a resistor whose impedance is Z, and has one end connected to the collector terminal of the third transistor 2c and the other end connected to the power supply Vcc.

A load 5d is a resistor whose impedance is Z, and has one end connected to the collector terminal of the fourth transistor 2d and the other end connected to the power supply Vcc.

In the polyphase filter of FIG. 1, it is assumed that a load circuit such as a transimpedance amplifier is connected to each of the first output terminal 4a, the second output terminal 4b, the third output terminal 4c, and the fourth output terminal 4d, and when such a load circuit is connected, the loads 5a to 5d do not need to be connected as shown in FIG. 2.

Figure 3:
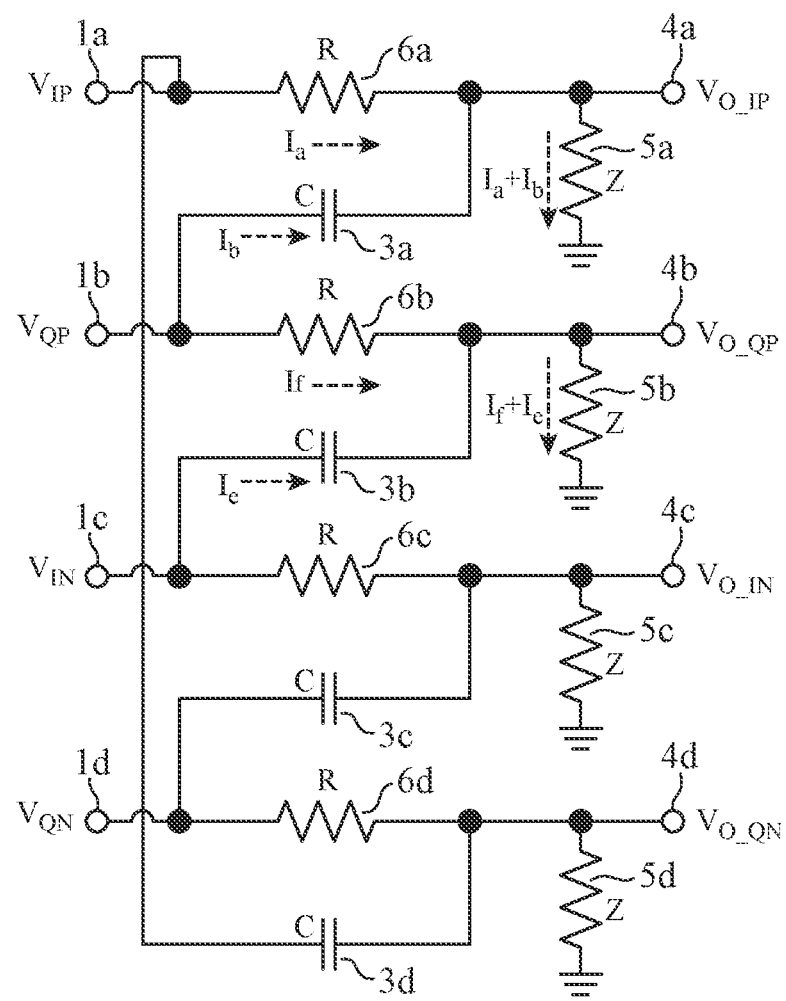
FIG. 3 is a circuit diagram showing a conventional polyphase filter including resistors.

FIG. 3 is a circuit diagram showing a conventional polyphase filter including resistors, and in FIG. 3 the same reference signs as those in FIGS. 1 and 2 denote the same or corresponding portions.

A resistor 6a is connected between the first input terminal 1a and the first output terminal 4a.

A resistor 6b is connected between the second input terminal 1b and the second output terminal 4b.

A resistor 6c is connected between the third input terminal 1c and the third output terminal 4c.

A resistor 6d is connected between the fourth input terminal 1d and the fourth output terminal 4d.

Next, operation will be described.

The conventional polyphase filter shown in FIG. 3 is analyzed to compare with a polyphase filter of the first embodiment.

First, a differential signal $\Delta V_{IOUT}$ related to I signals which is outputted from the conventional polyphase filter will be described. $\Delta V_{IOUT}$ is defined by: $\Delta V_{IOUT}=V_{O\_IP}-V_{O\_IN}$.

For example, a current $I_a$ flowing through the resistor 6a is represented by the following formula (2), and a current $I_b$ flowing through the first capacitor 3a is represented by the following formula (3).

Hence, a first I signal $V_{O\_IP}$ outputted from the first output terminal 4a is represented by the following formula (4):

$$I_a = \frac{V_{IP} - V_{O\_IP}}{R} \tag{2}$$

$$I_b = \frac{V_{QP} - V_{O\_IP}}{\frac{1}{j\omega C}} \tag{3}$$

$$V_{O\_IP} = Z(I_a + I_b) \tag{4}$$

In formulae (2) to (4), R represents the resistance value of the resistor 6a, C represents the capacitance value of the first capacitor 3a, and Z represents the impedance of the load 5a.

When the current $I_a$ represented by formula (2) and the current $I_b$ represented by formula (3) are substituted into formula (4), the first I signal $V_{O\_IP}$ outputted from the first output terminal 4a is represented by the following formula (5):

$$V_{O\_IP} = \frac{Z}{R + Z + j\omega CRZ}(j\omega CRV_{QP} + V_{IP}) \tag{5}$$

Although here the first I signal $V_{O\_IP}$ is described, a second I signal $V_{O\_IN}$ can also be obtained in the same manner.

The second I signal $V_{O\_IN}$ is represented by the following formula (6):

$$V_{O\_IN} = \frac{Z}{R + Z + j\omega CRZ}(j\omega CRZ_{QN} + V_{IN}) \tag{6}$$

By formulae (5) and (6), the differential signal $\Delta V_{IOUT}$ related to the I signals is obtained. The differential signal $\Delta V_{IOUT}$ is represented by the following formula (7):

$$\Delta V_{IOUT} = V_{O\_IP} - V_{O\_IN} = \tag{7}$$

$$\frac{Z}{R + Z + j\omega CRZ}(V_{IP} - V_{IN}) + \frac{j\omega CRZ}{R + Z + j\omega CRZ}(V_{QP} - V_{QN})$$

Next, a differential signal $\Delta V_{QOUT}$ related to Q signals which is outputted from the conventional polyphase filter will be described. $\Delta V_{QOUT}$ is defined by: $\Delta V_{QOUT} = V_{O\_QP} - V_{O\_QN}$.

For example, a current $I_f$ flowing through the resistor 6b is represented by the following formula (8), and a current $I_e$ flowing through the second capacitor 3b is represented by the following formula (9).

Hence, a first Q signal $V_{O\_QP}$ outputted from the second output terminal 4b is represented by the following formula (10):

$$I_f = \frac{V_{QP} - V_{O\_QP}}{R} \tag{8}$$

$$I_e = \frac{V_{IN} - V_{O\_QP}}{\frac{1}{j\omega C}} \tag{9}$$

$$V_{O\_QP} = Z(I_f + I_e) \tag{10}$$

In formulae (8) to (10), R represents the resistance value of the resistor 6b, C represents the capacitance value of the second capacitor 3b, and Z represents the impedance of the load 5b.

By substituting the current $I_f$ represented by formula (8) and the current $I_e$ represented by formula (9) into formula (10), the first Q signal $V_{O\_QP}$ outputted from the second output terminal 4b is represented by the following formula (11):

$$V_{O\_QP} = \frac{Z}{R + Z + j\omega CRZ}(V_{QP} + j\omega CRV_{IN}) \tag{11}$$

Although here the first Q signal $V_{O\_QP}$ is described, a second Q signal $V_{O\_QN}$ can also be obtained in the same manner.

The second Q signal $V_{O\_QN}$ is represented by the following formula (12):

$$V_{O\_QN} = \frac{Z}{R + Z + j\omega CRZ}(V_{QN} + j\omega CRV_{IP}) \tag{12}$$

By formulae (11) and (12), the differential signal $\Delta V_{QOUT}$ related to the Q signals is obtained. The differential signal $\Delta V_{QOUT}$ is represented by the following formula (13):

$$\Delta V_{QOUT} = V_{O\_QP} - V_{O\_QN} = \tag{13}$$

$$\frac{Z}{R + Z + j\omega CRZ}(V_{QP} - V_{QN}) - \frac{j\omega CRZ}{R + Z + j\omega CRZ}(V_{IP} - V_{IN})$$

Here, assuming that the input to the polyphase filter is an ideal differential signal ($V_{IP} + V_{IN} = 0$), it is assumed that the inputs to the polyphase filter are short-circuited by IQ as shown in the following formula (14). In this situation, the following formulae (15) and (16) hold:

$$V_{QP} - V_{QN} = V_{IP} - V_{IN} \tag{14}$$

$$\Delta V_{IOUT} = V_{O\_IP} - V_{O\_IN} = \frac{Z + j\omega CRZ}{R + Z + j\omega CRZ}(V_{IP} - V_{IN}) \tag{15}$$

$$\Delta V_{QOUT} = V_{O\_QP} - V_{O\_QN} = \frac{Z - j\omega CRZ}{R + Z + j\omega CRZ}(V_{IP} - V_{IN}) \tag{16}$$

It can be seen from formulae (15) and (16) that the amplitudes of the IQ signals are constant regardless of the frequency, and the phases of the IQ signals represents a 90-degree difference only at an angular frequency $\omega = 1/CR$. In addition, since the relation numerator>denominator is held, it can be seen that the IQ signals attenuates.

Next, the polyphase filter of FIG. 2 of the first embodiment is analyzed.

First, a differential signal $\Delta V_{IOUT}$ related to I signals which is outputted from the polyphase filter will be described. $\Delta V_{IOUT}$ is defined by: $\Delta V_{IOUT} = V_{O\_IP} - V_{O\_IN}$.

For example, a current $I_a$ flowing through the first transistor 2a is represented by the following formula (17), and a current $I_b$ flowing through the first capacitor 3a is represented by the following formula (18).

Hence, a first I signal $V_{O\_IP}$ outputted from the first output terminal 4a is represented by the following formula (19):

$$I_a = g_m \cdot V_{IP} \tag{17}$$

$$I_b = \frac{V_{O\_IP} - V_{QP}}{\frac{1}{j\omega C}} \tag{18}$$

$$V_{O\_IP} = (I_a + I_b)Z \tag{19}$$

In formula (17), $g_m$ is the transconductance of the first transistor 2a.

By substituting the current $I_a$ represented by formula (17) and the current $I_b$ represented by formula (18) into formula (19), the first I signal $V_{O\_IP}$ outputted from the first output terminal 4a is represented by the following formula (20):

$$V_{O\_IP} = \frac{1}{(1 - j\omega CZ)}(-j\omega CZV_{QP} + g_m ZV_{IP}) \tag{20}$$

Although here the first I signal $V_{O\_IP}$ is described, a second I signal $V_{O\_IN}$ can also be obtained in the same manner.

The second I signal $V_{O\_IN}$ is represented by the following formula (21):

$$V_{O\_IN} = \frac{1}{(1 - j\omega CZ)}(-j\omega CZV_{QN} + g_m ZV_{IN}) \tag{21}$$

By formulae (20) and (21), the differential signal $\Delta V_{IOUT}$ related to the I signals is obtained. The differential signal $\Delta V_{IOUT}$ is represented by the following formula (22):

$$\Delta V_{IOUT} = V_{O\_IP} - V_{O\_IN} = \tag{22}$$

$$\frac{1}{(1 - j\omega CZ)}\{-j\omega CZ(V_{QP} - V_{QN}) + g_m Z(V_{IP} - V_{IN})\}$$

Next, a differential signal $\Delta V_{QOUT}$ related to Q signals which is outputted from the polyphase filter will be described. $\Delta V_{QOUT}$ is defined by: $\Delta V_{QOUT} = V_{O\_QP} - V_{O\_QN}$.

For example, a current $I_f$ flowing through the second transistor 2b is represented by the following formula (23), and a current $I_e$ flowing through the second capacitor 3b is represented by the following formula (24).

Hence, a first Q signal $V_{O\_QP}$ outputted from the second output terminal 4b is represented by the following formula (25):

$$I_f = g_m \cdot V_{QP} \tag{23}$$

$$I_e = \frac{V_{O\_QP} - V_{IN}}{\frac{1}{j\omega C}} \tag{24}$$

$$V_{O\_QP} = (I_f + I_e)Z \tag{25}$$

By substituting the current $I_f$ represented by formula (23) and the current $I_e$ represented by formula (24) into formula (25), the first Q signal $V_{O\_QP}$ outputted from the second output terminal 4b is represented by the following formula (26):

$$V_{O\_QP} = \frac{1}{(1 - j\omega CZ)}(-j\omega CZV_{IN} + g_m ZV_{QP}) \tag{26}$$

Although here the first Q signal $V_{O\_QP}$ is described, a second Q signal $V_{O\_QN}$ can also be obtained in the same manner.

The second Q signal $V_{O\_QN}$ is represented by the following formula (27):

$$V_{O\_QN} = \frac{1}{(1 - j\omega CZ)}(-j\omega CZV_{IP} + g_m ZV_{QN}) \tag{27}$$

By formulae (26) and (27), the differential signal $\Delta V_{QOUT}$ related to the Q signals is obtained. The differential signal $\Delta V_{QOUT}$ is represented by the following formula (28):

$$\Delta V_{QOUT} = \tag{28}$$

$$V_{O\_QP} - V_{O\_QN} = \frac{1}{(1 - j\omega CZ)}\{j\omega CZ(V_{IP} - V_{IN}) + g_m Z(V_{QP} - V_{QN})\}$$

Here, assuming that the input to the polyphase filter is an ideal differential signal ($V_{IP}+V_{IN}=0$), it is assumed that the inputs to the polyphase filter are short-circuited by IQ as shown in the following formula (29). In this situation, the following formulae (30) and (31) hold:

$$V_{QP} - V_{QN} = V_{IP} - V_{IN} \tag{29}$$

$$\Delta V_{IOUT} = \frac{Z - j\frac{\omega C}{g_m}Z}{\left(\frac{1}{g_m} - j\frac{\omega C}{g_m}Z\right)}(V_{IP} - V_{IN}) \tag{30}$$

$$\Delta V_{QOUT} = \frac{Z + j\frac{\omega C}{g_m}Z}{\left(\frac{1}{g_m} - j\frac{\omega C}{g_m}Z\right)}(V_{IP} - V_{IN}) \tag{31}$$

It can be seen from formulae (30) and (31) that the amplitudes of the IQ signals are always constant, and the phases of the IQ signals represent a 90-degree difference at an angular frequency $\omega = g_m/CR$.

The following table 1 shows comparison between the transfer function of the polyphase filter of FIG. 3 that includes the resistors 6a to 6d and the transfer function of the polyphase filter of FIG. 2 of the first embodiment:

TABLE 1

| | Transfer Function of I Signal | Transfer Function of Q Signal |
|---|---|---|
| Polyphase Filter of FIG. 3 Including Resistors | $\Delta V_{IOUT} = \dfrac{Z + j\omega CRZ}{R + Z + j\omega CRZ}(V_{IP} - V_{IN})$ | $\Delta V_{QOUT} = \dfrac{Z - j\omega CRZ}{R + Z + j\omega CRZ}(V_{IP} - V_{IN})$ |
| Polyphase Filter of FIG. 2 of First Embodiment | $\Delta V_{IOUT} = \dfrac{Z - j\frac{\omega C}{g_m}Z}{\left(\frac{1}{g_m} - j\frac{\omega C}{g_m}Z\right)}(V_{IP} - V_{IN})$ | $\Delta V_{QOUT} = \dfrac{Z + j\frac{\omega C}{g_m}Z}{\left(\frac{1}{g_m} - j\frac{\omega C}{g_m}Z\right)}(V_{IP} - V_{IN})$ |

The polyphase filter of the first embodiment differs from the polyphase filter of FIG. 3 in that the resistors 6a to 6d of the polyphase filter of FIG. 3 are replaced by the first transistor 2a, the second transistor 2b, the third transistor 2c, and the fourth transistor 2d.

Hence, also in the polyphase filter of the first embodiment, as with the polyphase filter of FIG. 3, the amplitudes of the IQ signals are always constant, and the phases of the IQ signals represent a 90-degree difference at the angular frequency ω.

Therefore, the polyphase filter of the first embodiment can implement the same IQ characteristics as the polyphase filter of FIG. 3.

However, unlike the polyphase filter of FIG. 3, the polyphase filter of the first embodiment is formed using transistors having the transconductance $g_m$, and thus can have gain.

The gain that the polyphase filter of the first embodiment can have is determined in accordance with the magnitude relationship between the transconductance $g_m$ and $\omega C$, as shown in the following table 2. ω is the angular frequency and C is the capacitance value of each of the first capacitor 3a, the second capacitor 3b, the third capacitor 3c, and the fourth capacitor 3d.

TABLE 2

| | Gain |
|---|---|
| $\omega C \gg g_m$ | 1 |
| $\omega C = g_m$ | $\dfrac{\sqrt{2}\,Z}{\sqrt{Z^2 + \frac{1}{g_m^2}}}$ |
| $\omega C \ll g_m$ | $g_m \cdot Z$ |

When $\omega C = g_m$, since the numerator is larger than the denominator, the gain is greater than or equal to 1. In addition, when $\omega C \ll g_m$, the gain is greater than or equal to 1, too.

Therefore, the polyphase filter of the first embodiment can have a gain greater than or equal to 1 regardless of the magnitude relationship between the transconductance $g_m$ and $\omega C$.

In addition, in the polyphase filter of the first embodiment, the angular frequency is determined by $\omega = g_m/CR$. Since the transconductance $g_m$ is determined by a current flowing through the transistor, the angular frequency ω can be changed by changing the current. Therefore, in the polyphase filter of the first embodiment, it is possible to change the characteristics.

As is clear from the above, according to the first embodiment, the configuration includes: a first transistor 2a amplifying a first I signal $V_{IP}$ inputted from a first input terminal 1a; a second transistor 2b amplifying a first Q signal $V_{QP}$ inputted from a second input terminal 1b; a third transistor 2c amplifying a second I signal $V_{IN}$ when the second I signal $V_{IN}$ is inputted from a third input terminal 1c, the second I signal $V_{IN}$ forming a differential signal with the first I signal $V_{IP}$; a fourth transistor 2d amplifying a second Q signal $V_{QN}$ when the second Q signal $V_{QN}$ is inputted from a fourth input terminal 1d, the second Q signal $V_{QN}$ forming a differential signal with the first Q signal $V_{QP}$. Thus, an effect of being able to suppress the occurrence of pass loss is achieved.

In addition, a polyphase filter that has gain and that can change its characteristics can be obtained.

In addition, according to the first embodiment, the collector terminals of the first transistor 2a, the second transistor 2b, the third transistor 2c, and the fourth transistor 2d are connected to the power supply Vcc through the loads 5a, 5b, 5c, and 5d, respectively, and thus, NPN bipolar transistors can be used as the first transistor 2a, the second transistor 2b, the third transistor 2c, and the fourth transistor 2d.

Although the first embodiment shows an example in which the first transistor 2a, the second transistor 2b, the third transistor 2c, and the fourth transistor 2d are bipolar transistors, the transistors are not limited to bipolar transistors and any transistor having the transconductance $g_m$ may be used for them.

Hence, the first transistor 2a, the second transistor 2b, the third transistor 2c, and the fourth transistor 2d may be, for example, field-effect transistors or MOS transistors such as complementary metal oxide semiconductor (CMOS) transistors.

Note that when the first transistor 2a, the second transistor 2b, the third transistor 2c, and the fourth transistor 2d are field-effect transistors, the gate terminal of the field-effect transistor corresponds to the base terminal of the bipolar transistor.

In addition, the drain terminal of the field-effect transistor corresponds to the collector terminal of the bipolar transistor, and the source terminal of the field-effect transistor corresponds to the emitter terminal of the bipolar transistor.

Second Embodiment

The above-described first embodiment shows an example in which the emitter terminal of each of the first transistor 2a, the second transistor 2b, the third transistor 2c, and the fourth transistor 2d are grounded.

In this second embodiment, an example will be described in which the emitter terminal of the first transistor 2a and the emitter terminal of the third transistor 2c are connected to the ground through a first current source 7a, and the emitter terminal of the second transistor 2b and the emitter terminal of the fourth transistor 2d are connected to the ground through a second current source 7b.

Figure 4:
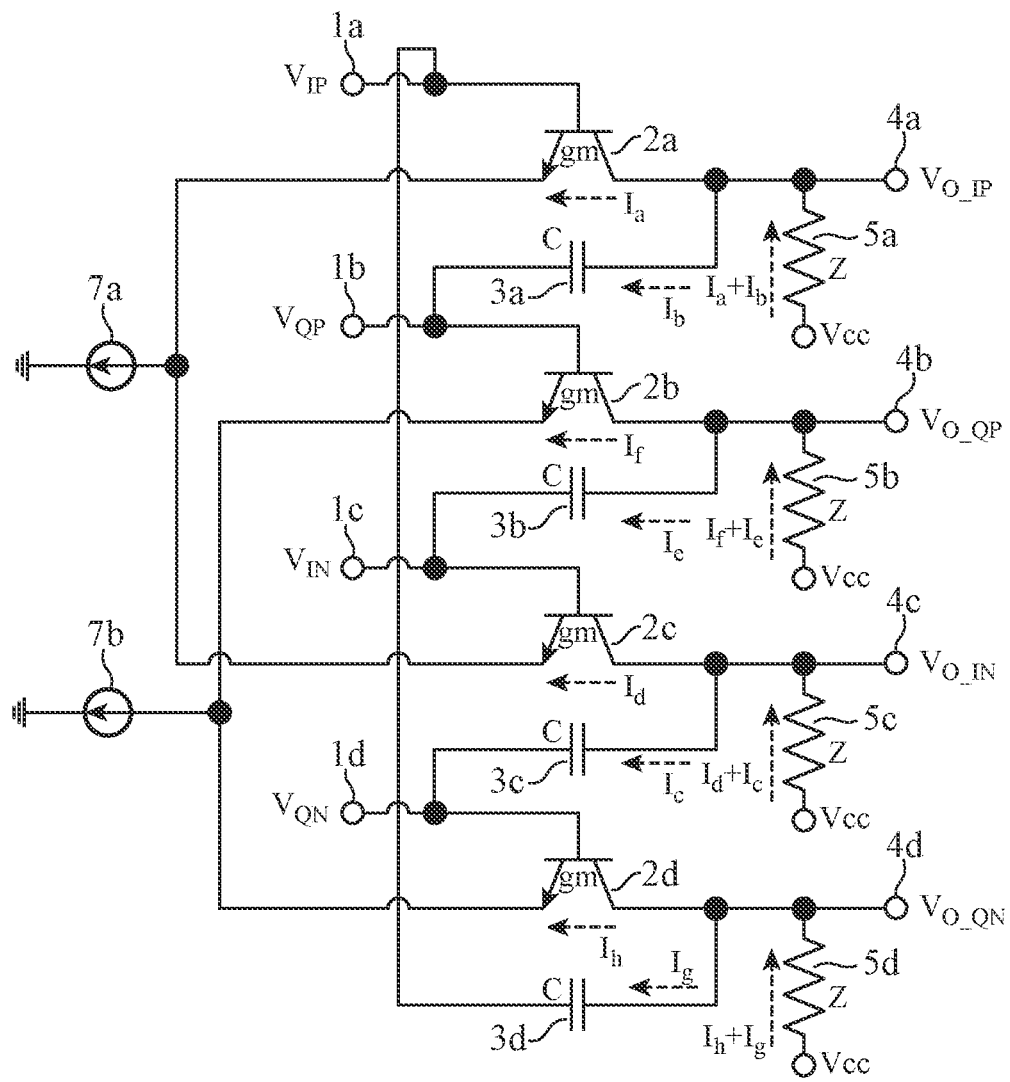
FIG. 4 is a circuit diagram showing a polyphase filter of a second embodiment of the invention.

FIG. 4 is a circuit diagram showing a polyphase filter of the second embodiment of the invention. In FIG. 4, the same reference signs as those in FIGS. 1 and 2 denote the same or corresponding portions, and thus, description thereof is omitted.

The first current source 7a has a+side connected to the emitter terminal of the first transistor 2a and the emitter terminal of the third transistor 2c, and a−side connected to the ground.

The second current source 7b has a+side connected to the emitter terminal of the second transistor 2b and the emitter terminal of the fourth transistor 2d, and a−side connected to the ground.

Although in FIG. 4 the collector terminals of the first transistor 2a, the second transistor 2b, the third transistor 2c, and the fourth transistor 2d are connected to the power supply Vcc through the loads 5a, 5b, 5c, and 5d, respectively, when a load circuit such as a transimpedance amplifier is connected to each of the first output terminal 4a, the second output terminal 4b, the third output terminal 4c, and the fourth output terminal 4d, the loads 5a to 5d do not need to be connected.

Next, operation will be described.

Even when differential imbalance occurs between the first I signal $V_{IP}$ and the second I signal $V_{IN}$, by connecting the emitter terminal of the first transistor 2a and the emitter terminal of the third transistor 2c to the ground through the first current source 7a, the current $I_a$ flowing through the first transistor 2a and the current $I_d$ flowing through the third transistor 2c become a differential signal.

In addition, even when differential imbalance occurs between the first Q signal $V_{QP}$ and the second Q signal $V_{QN}$, by connecting the emitter terminal of the second transistor 2b and the emitter terminal of the fourth transistor 2d to the ground through the second current source 7b, the current $I_f$ flowing through the second transistor 2b and the current $I_h$ flowing through the fourth transistor 2d become a differential signal.

By this, the accuracy of suppression of image disturbing waves by the polyphase filter can be increased comparing with the above-described first embodiment.

The second embodiment shows an example in which the emitter terminal of the first transistor 2a and the emitter terminal of the third transistor 2c are connected to the ground through the first current source 7a, and the emitter terminal of the second transistor 2b and the emitter terminal of the fourth transistor 2d are connected to the ground through the second current source 7b.

Figure 5:
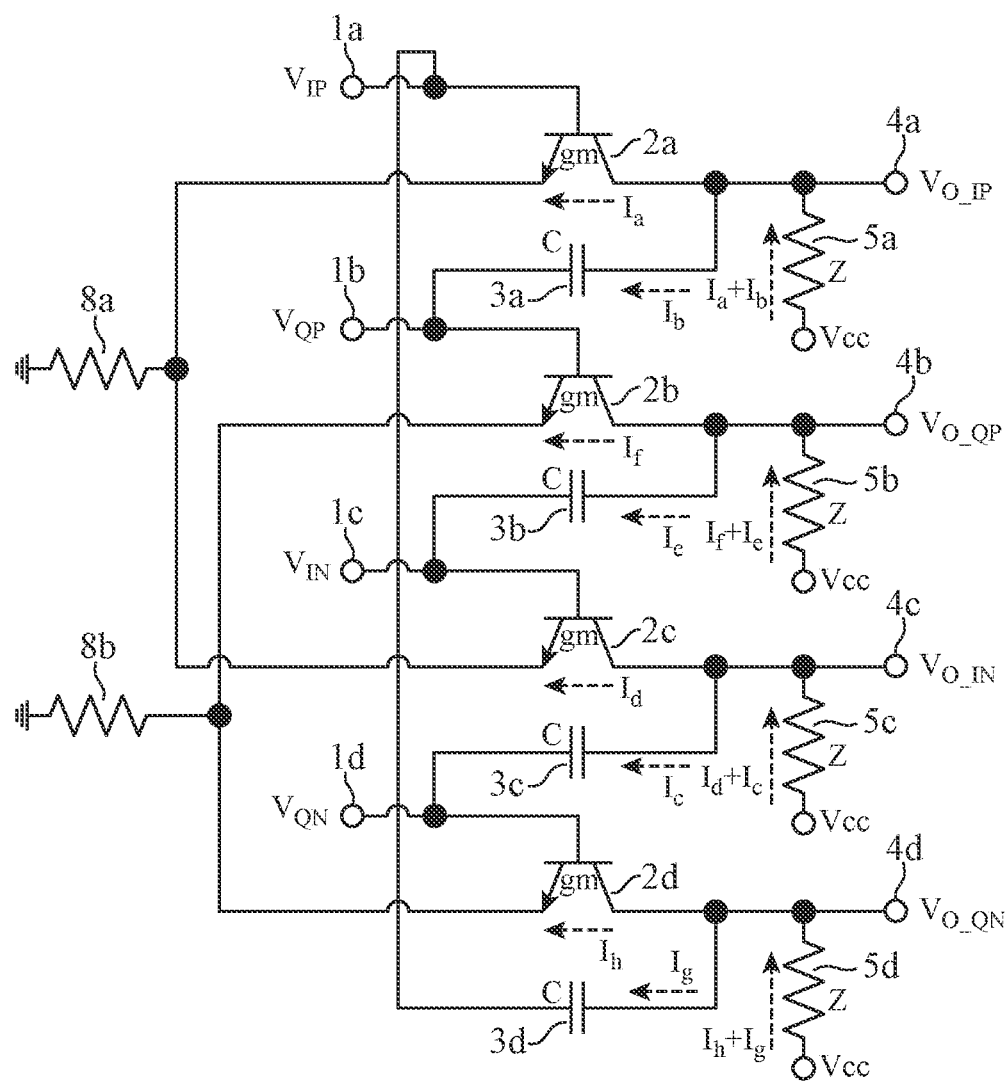
FIG. 5 is a circuit diagram showing another polyphase filter of the second embodiment of the invention.

As shown in FIG. 5, also when a first resistor 8a is connected instead of the first current source 7a and a second resistor 8b is connected instead of the second current source 7b, the same effect can be obtained.

FIG. 5 is a circuit diagram showing another polyphase filter of the second embodiment of the invention.

Although the second embodiment shows an example in which the first transistor 2a, the second transistor 2b, the third transistor 2c, and the fourth transistor 2d are bipolar transistors, as in the above-described first embodiment, the transistors may be, for example, field-effect transistors or MOS transistors such as CMOS transistors.

Third Embodiment

The above-described first embodiment shows an example in which the emitter terminal of each of the first transistor 2a, the second transistor 2b, the third transistor 2c, and the fourth transistor 2d is grounded.

In this third embodiment, an example will be described in which a base terminal of each of a first transistor 9a, a second transistor 9b, a third transistor 9c, and a fourth transistor 9d is grounded.

Figure 6:
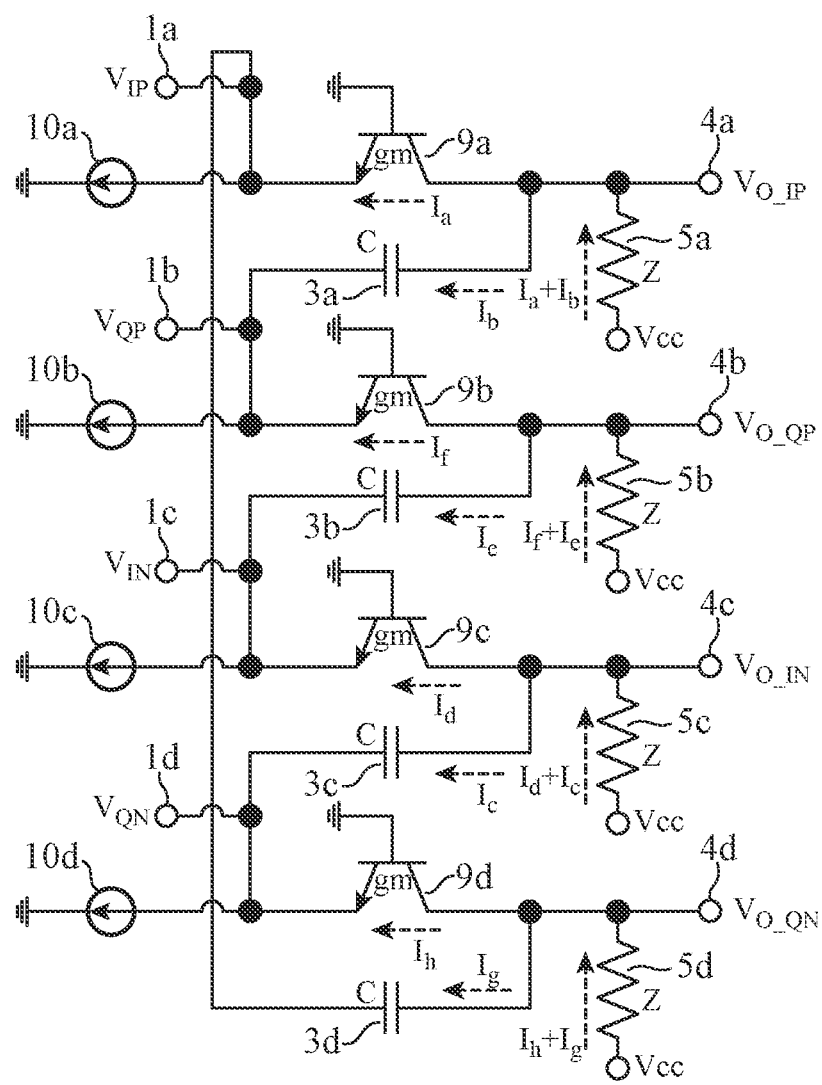
FIG. 6 is a circuit diagram showing a polyphase filter of a third embodiment of the invention.

FIG. 6 is a circuit diagram showing a polyphase filter of the third embodiment of the invention. In FIG. 6, the same reference signs as those in FIGS. 1 and 2 denote the same or corresponding portions, and thus, description thereof is omitted.

The first transistor 9a is a bipolar transistor having a transconductance $g_m$ and having a base terminal grounded.

The first transistor 9a has an emitter terminal connected to the first input terminal 1a and a collector terminal (an output terminal of the first transistor 9a) connected to the first output terminal 4a, and amplifies a first I signal $V_{IP}$ inputted from the first input terminal 1a and outputs the amplified first I signal $V_{IP}$ to the first output terminal 4a.

The second transistor 9b is a bipolar transistor having a transconductance $g_m$ and having a base terminal grounded.

The second transistor 9b has an emitter terminal connected to the second input terminal 1b and a collector terminal (an output terminal of the second transistor 9b) connected to the second output terminal 4b, and amplifies a first Q signal $V_{QP}$ inputted from the second input terminal 1b and outputs the amplified first Q signal $V_{QP}$ to the second output terminal 4b.

The third transistor 9c is a bipolar transistor having a transconductance $g_m$ and having a base terminal grounded.

The third transistor 9c has an emitter terminal connected to the third input terminal 1c and a collector terminal (an output terminal of the third transistor 9c) connected to the third output terminal 4c, and amplifies a second I signal $V_{IN}$ inputted from the third input terminal 1c and outputs the amplified second I signal $V_{IN}$ to the third output terminal 4c.

The fourth transistor 9d is a bipolar transistor having a transconductance $g_m$ and having a base terminal grounded.

The fourth transistor 9d has an emitter terminal connected to the fourth input terminal 1d and a collector terminal (an output terminal of the fourth transistor 9d) connected to the fourth output terminal 4d, and amplifies a second Q signal $V_{QN}$ inputted from the fourth input terminal 1d and outputs the amplified second Q signal $V_{QN}$ to the fourth output terminal 4d.

A first current source 10a has a+side connected to the emitter terminal of the first transistor 9a and a−side connected to the ground.

A second current source 10b has a+side connected to the emitter terminal of the second transistor 9b and a−side connected to the ground.

A third current source 10c has a+side connected to the emitter terminal of the third transistor 9c and a−side connected to the ground.

A fourth current source 10d has a+side connected to the emitter terminal of the fourth transistor 9d and a−side connected to the ground.

Although in FIG. 6 the collector terminals of the first transistor 9a, the second transistor 9b, the third transistor 9c, and the fourth transistor 9d are connected to the power supply Vcc through the loads 5a, 5b, 5c, and 5d, respectively, when a load circuit such as a transimpedance amplifier is connected to each of the first output terminal 4a, the second output terminal 4b, the third output terminal 4c, and the fourth output terminal 4d, the loads 5a to 5d do not need to be connected.

Next, operation will be described.

The operation of the polyphase filter of the third embodiment is almost the same as that of the polyphase filter of the above-described first embodiment.

However, in the third embodiment, the base terminal of each of the first transistor 9a, the second transistor 9b, the third transistor 9c, and the fourth transistor 9d is grounded.

Hence, the input impedances viewed from the first input terminal 1a, the second input terminal 1b, the third input terminal 1c, and the fourth input terminal 1d can be set to $1/g_m$ of the impedances in the first transistor 9a, the second transistor 9b, the third transistor 9c, and the fourth transistor 9d.

By this, by setting the transconductances $g_m$ of the first transistor 9a, the second transistor 9b, the third transistor 9c, and the fourth transistor 9d in accordance with the output impedances viewed from the first output terminal 4a, the second output terminal 4b, the third output terminal 4c, and the fourth output terminal 4d, broadband input and output matching can be implemented. In addition, by eliminating unnecessary matching elements, the size can be reduced, and broadband performance can be enhanced.

In the third embodiment, the emitter terminal of the first transistor 9a is connected to the ground through the first current source 10a, and the emitter terminal of the second transistor 9b is connected to the ground through the second current source 10b. In addition, the emitter terminal of the third transistor 9c is connected to the ground through the third current source 10c, and the emitter terminal of the fourth transistor 9d is connected to the ground through the fourth current source 10d.

Figure 7:
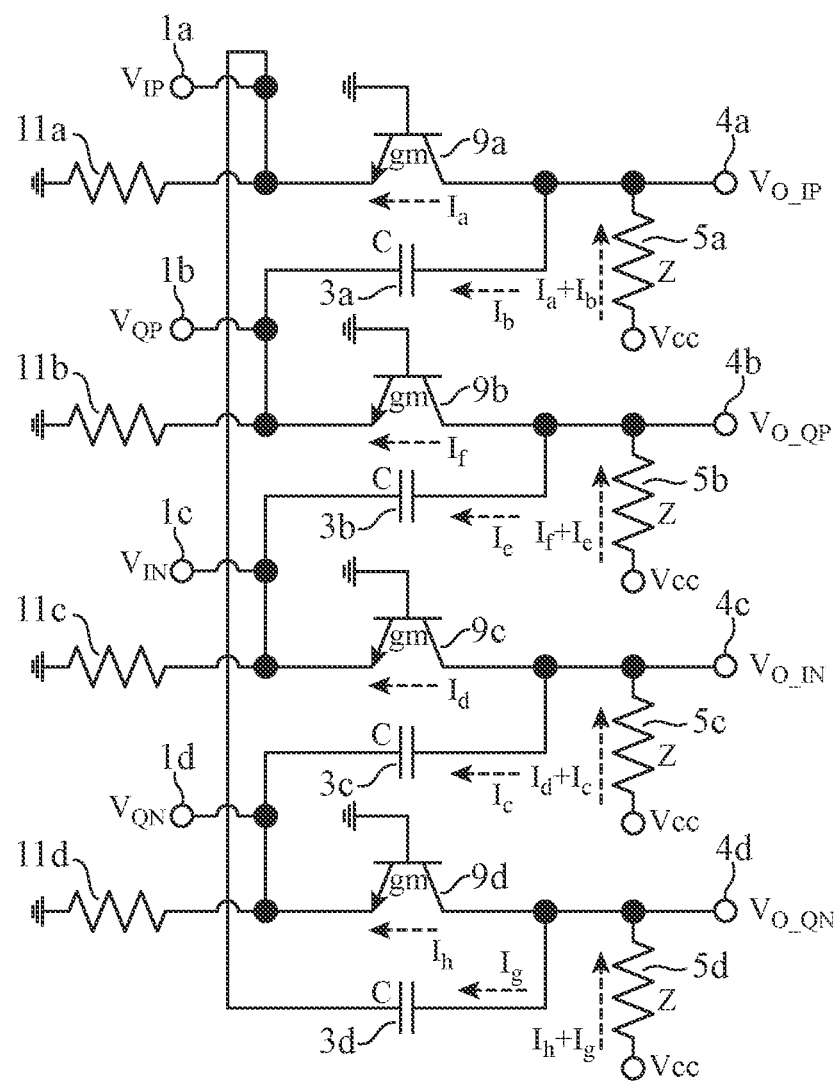
FIG. 7 is a circuit diagram showing another polyphase filter of the third embodiment of the invention.

As shown in FIG. 7, the following configuration can also be employed: a first resistor 11a is connected instead of the first current source 10a, a second resistor 11b is connected instead of the second current source 10b, a third resistor 11c is connected instead of the third current source 10c, and a fourth resistor 11d is connected instead of the fourth current source 10d. In this case, too, the same effects can be obtained.

FIG. 7 is a circuit diagram showing another polyphase filter of the third embodiment of the invention.

Although the third embodiment shows an example in which the first transistor 9a, the second transistor 9b, the third transistor 9c, and the fourth transistor 9d are bipolar transistors, the first transistor 9a, the second transistor 9b, the third transistor 9c, and the fourth transistor 9d may be, for example, field-effect transistors or MOS transistors such as CMOS transistors.

Note that in the present invention, a free combination of the embodiments, modifications to any component of the embodiments, or omissions of any component in the embodiments are possible within the scope of the invention.

INDUSTRIAL APPLICABILITY

The invention is suitable for a polyphase filter including a transistor.

REFERENCE SIGNS LIST

1a: First input terminal, 1b: Second input terminal, 1c: Third input terminal, 1d: Fourth input terminal, 2a: First transistor, 2b: Second transistor, 2c: Third transistor, 2d: Fourth transistor, 3a: First capacitor, 3b: Second capacitor, 3c: Third capacitor, 3d: Fourth capacitor, 4a: First output terminal, 4b: Second output terminal, 4c: Third output terminal, 4d: Fourth output terminal, 5a to 5d: Load, 6a to 6d: Resistor, 7a: First current source, 7b: Second current source, 8a: First resistor, 8b: Second resistor, 9a: First transistor, 9b: Second transistor, 9c: Third transistor, 9d: Fourth transistor, 10a: First current source, 10b: Second current source, 10c: Third current source, 10d: Fourth current source, 11a: First resistor, 11b: Second resistor, 11c: Third resistor, and 11d: Fourth resistor.

The invention claimed is:

1. A polyphase filter comprising:
a first transistor amplifying a first I signal inputted from a first input terminal;
a second transistor amplifying a first Q signal inputted from a second input terminal;
a third transistor amplifying a second I signal when the second I signal is inputted from a third input terminal, the second I signal forming a differential signal with the first I signal;
a fourth transistor amplifying a second Q signal when the second Q signal is inputted from a fourth input terminal, the second Q signal forming a differential signal with the first Q signal;
a first capacitor connected between an output terminal of the first transistor and the second input terminal;
a second capacitor connected between an output terminal of the second transistor and the third input terminal;
a third capacitor connected between an output terminal of the third transistor and the fourth input terminal; and
a fourth capacitor connected between an output terminal of the fourth transistor and the first input terminal,
wherein an angular frequency determined in accordance with a transconductance of each of the first to fourth transistors and a capacitance of each of the first to fourth capacitors is changed by changing a current flowing through each of the first to fourth transistors, and
wherein each of the first to fourth transistors is a bipolar transistor whose base terminal is grounded,
an emitter terminal of the first transistor is connected to the first input terminal, and a collector terminal of the first transistor is the output terminal of the first transistor,
an emitter terminal of the second transistor is connected to the second input terminal, and a collector terminal of the second transistor is the output terminal of the second transistor,
an emitter terminal of the third transistor is connected to the third input terminal, and a collector terminal of the third transistor is the output terminal of the third transistor, and
an emitter terminal of the fourth transistor is connected to the fourth input terminal, and a collector terminal of the fourth transistor is the output terminal of the fourth transistor.

2. The polyphase filter according to claim 1, wherein the emitter terminal of the first transistor is connected to a ground through a first current source or a first resistor, the emitter terminal of the second transistor is connected to a ground through a second current source or a second resistor, the emitter terminal of the third transistor is connected to a ground through a third current source or a third resistor, and the emitter terminal of the fourth transistor is connected to a ground through a fourth current source or a fourth resistor.

3. A polyphase filter comprising:
a first transistor amplifying a first I signal inputted from a first input terminal;
a second transistor amplifying a first Q signal inputted from a second input terminal;
a third transistor amplifying a second I signal when the second I signal is inputted from a third input terminal, the second I signal forming a differential signal with the first I signal;
a fourth transistor amplifying a second Q signal when the second Q signal is inputted from a fourth input terminal, the second Q signal forming a differential signal with the first Q signal;
a first capacitor connected between an output terminal of the first transistor and the second input terminal;
a second capacitor connected between an output terminal of the second transistor and the third input terminal;
a third capacitor connected between an output terminal of the third transistor and the fourth input terminal; and
a fourth capacitor connected between an output terminal of the fourth transistor and the first input terminal,
wherein an angular frequency determined in accordance with a transconductance of each of the first to fourth transistors and a capacitance of each of the first to fourth capacitors by changing a current flowing through each of the first to fourth transistors, and
wherein each of the first to fourth transistors is a field-effect transistor whose gate terminal is grounded,
a source terminal of the first transistor is connected to the first input terminal, and a drain terminal of the first transistor is the output terminal of the first transistor,
a source terminal of the second transistor is connected to the second input terminal, and a drain terminal of the second transistor is the output terminal of the second transistor,
a source terminal of the third transistor is connected to the third input terminal, and a drain terminal of the third transistor is the output terminal of the third transistor, and
a source terminal of the fourth transistor is connected to the fourth input terminal, and a drain terminal of the fourth transistor is the output terminal of the fourth transistor.

4. The polyphase filter according to claim 3, wherein
the source terminal of the first transistor is connected to a ground through a first current source or a first resistor,
the source terminal of the second transistor is connected to a ground through a second current source or a second resistor,
the source terminal of the third transistor is connected to a ground through a third current source or a third resistor, and
the source terminal of the fourth transistor is connected to a ground through a fourth current source or a fourth resistor.

* * * * *